United States Patent
Bourgin

(10) Patent No.: US 7,331,030 B2
(45) Date of Patent: Feb. 12, 2008

(54) METHOD TO UNATE A DESIGN FOR IMPROVED SYNTHESIZABLE DOMINO LOGIC FLOW

(75) Inventor: Bernard Bourgin, San Diego, CA (US)

(73) Assignee: STMicroelectronics, Inc., Carrollton, TX (US)

( * ) Notice: Subject to any disclaimer, the term of this patent is extended or adjusted under 35 U.S.C. 154(b) by 356 days.

(21) Appl. No.: 11/015,512

(22) Filed: Dec. 17, 2004

(65) Prior Publication Data

US 2006/0136859 A1    Jun. 22, 2006

(51) Int. Cl.
    *G06F 17/50* (2006.01)
(52) U.S. Cl. .............................. 716/18; 716/17; 716/3; 716/7
(58) Field of Classification Search .............. 716/17, 716/18, 3, 7
    See application file for complete search history.

(56) References Cited

U.S. PATENT DOCUMENTS

| | | | |
|---|---|---|---|
| 5,041,742 A | | 8/1991 | Carbonaro |
| 5,524,082 A | * | 6/1996 | Horstmann et al. ............. 716/2 |
| 5,774,369 A | * | 6/1998 | Horstmann et al. ............. 716/2 |
| 5,883,529 A | | 3/1999 | Kumata et al. |
| 5,903,467 A | * | 5/1999 | Puri et al. ........................ 716/1 |
| 5,930,148 A | | 7/1999 | Bjorksten et al. |
| 5,990,706 A | * | 11/1999 | Matsumoto et al. .......... 326/98 |
| 6,018,621 A | * | 1/2000 | Puri et al. ........................ 716/1 |
| 6,035,110 A | * | 3/2000 | Puri et al. ........................ 716/6 |
| 6,209,121 B1 | | 3/2001 | Goto |
| 6,212,670 B1 | * | 4/2001 | Kaviani ........................ 716/17 |
| 6,499,129 B1 | * | 12/2002 | Srinivasan et al. ............. 716/4 |
| 6,549,038 B1 | * | 4/2003 | Sechen et al. ................. 326/93 |
| 6,556,962 B1 | * | 4/2003 | Patra ............................. 703/14 |
| 6,721,926 B2 | * | 4/2004 | Wang et al. ..................... 716/2 |
| 6,851,095 B1 | * | 2/2005 | Srinivasan et al. ............. 716/4 |
| 6,854,096 B2 | * | 2/2005 | Eaton et al. ..................... 716/2 |
| 7,000,202 B1 | * | 2/2006 | Srinivasan et al. ............. 716/4 |
| 7,117,461 B1 | * | 10/2006 | Srinivasan et al. ............. 716/4 |
| 7,254,796 B2 | * | 8/2007 | Hossain et al. ................. 716/6 |
| 2002/0178432 A1 | * | 11/2002 | Kim et al. ..................... 716/18 |
| 2003/0145288 A1 | * | 7/2003 | Wang et al. .................... 716/2 |
| 2004/0103377 A1 | * | 5/2004 | Eaton et al. ................... 716/1 |
| 2004/0155678 A1 | | 8/2004 | Anderson et al. |
| 2005/0278681 A1 | * | 12/2005 | Hossain et al. ............... 716/17 |
| 2006/0120189 A1 | * | 6/2006 | Beerel et al. ............... 365/203 |
| 2006/0253808 A1 | * | 11/2006 | Zounes .......................... 716/1 |

OTHER PUBLICATIONS

D. Harris, "Skew-Tolerant Circuit Design", Morgan Kaufman Publishers, San Francisco, CA 2001, Chapter 1, pp. 1-31 and section 3.2., pp.79-95.

K. Bernstein et al., "High Speed CMOS Design Styles", Kluwer Academic Publishers, Boston, 1998, pp. 91-131.

\* cited by examiner

*Primary Examiner*—Phallaka Kik
(74) *Attorney, Agent, or Firm*—Lisa K. Jorgenson; William J. Kubida

(57) ABSTRACT

A fully automated ASIC style domino synthesis flow is provided for mapping a digital logic design onto a domino logic library. The input to the flow is the same as for standard static synthesis environments and includes an RTL description of the design to be synthesized and a set of timing and physical constraints. The unate step includes reading the design and initializing, simplifying the logic, marking inversions, marking binate cones for duplication, identifying endpoints, performing a reverse traversal, an optional phase optimization, committing netlist changes, primary inputs processing, primary outputs processing, and a final check and save.

20 Claims, 8 Drawing Sheets

DOMINO LOGIC IMPLEMENTATION FLOW

UNATING FLOW

LOGIC SIMPLIFICATION:
DANGLING CONES ARE REMOVED

⊠ INVERSION MARKER

INVERSION MARKING:
INVERSIONS ARE TURNED INTO MARKERS

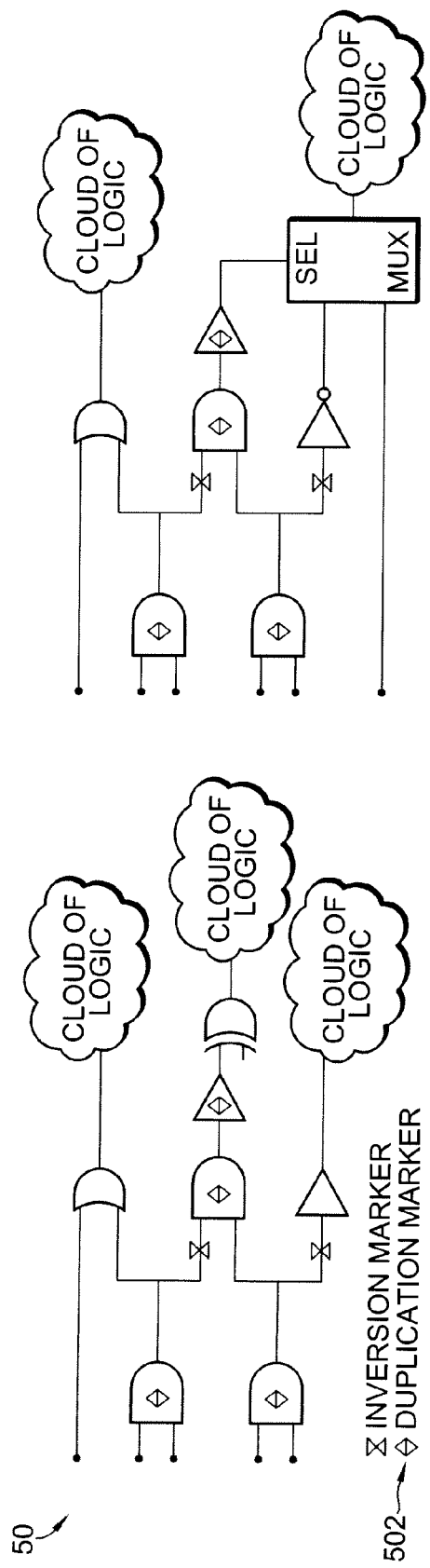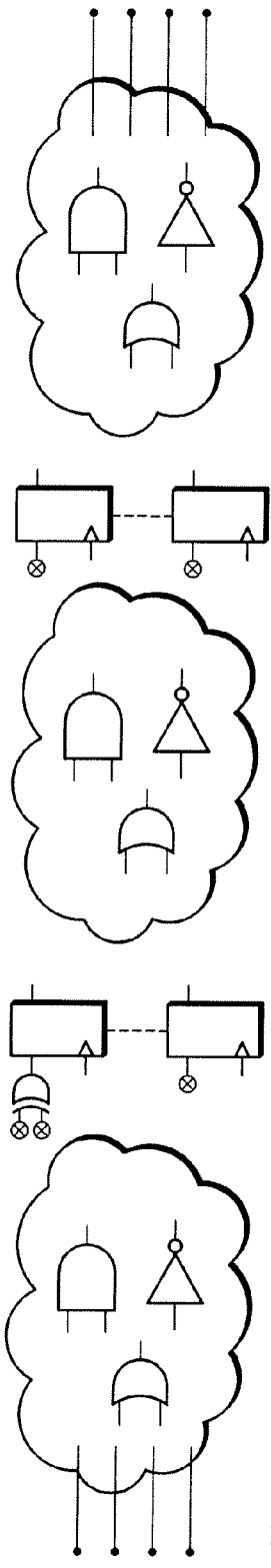
Fig. 5
BINATE CONES ARE MARKED FOR DUPLICATION (2 EXAMPLES)
Fig. 6
ENDPOINT MARKING: SEQUENTIAL INPUTS + PRIMARY OUTPUTS

REVERSE TRAVERSAL APPLYING DE-MORGAN LAW

COMMIT CHANGES: DUPLICATE & SWITCH TO DUAL

METHOD TO UNATE A DESIGN FOR IMPROVED SYNTHESIZABLE DOMINO LOGIC FLOW

CROSS REFERENCE TO RELATED PATENT APPLICATIONS

The present invention is related to the subject matter of U.S. patent application Ser. No. 10/248,721, now U.S. Pat. No. 6,954,909, for: "Method for Synthesizing Domino Logic Circuits" and U.S. patent application Ser. No. 11/015,513, now U.S. Pat. No. 7,245,157, for: "Dynamic Phase Assignment Optimization Using Skewed Static Buffers In Place Of Dynamic Buffers" and is further related to the subject matter of U.S. patent application Ser. No. 11/015,317, now U.S. patent application publication No. 2006/0136852, for: "Method And Apparatus for Mixing Static Logic With Domino Logic", all of which are filed concurrently and assigned to ST Microelectronics, Inc., Carrollton, Tex. and the disclosures of which are herein specifically incorporated in their entirety by this reference.

BACKGROUND OF THE INVENTION

The present invention relates to domino logic circuits. More particularly, the present invention relates to a method of automatically mapping a digital logic design onto a domino logic library.

Domino logic is a precharged CMOS logic family first introduced in 1982. The logic style has inherent speed advantages over static logic leading to its use in microprocessors and other high performance digital blocks. The speed advantages of domino logic are accompanied by much greater design complexity, as well as increased integrated circuit die area and power consumption. Standard ASIC tools are not designed to accommodate domino logic timing models and behavior. This has limited the use of domino logic to custom and structured custom design flows. In recent years the increasing consumerization of electronics has forced time-to-market and cost considerations to become a major factor in design choices. Both of these factors, obviously, limit the use of domino logic.

As discussed, the use of domino logic in a logic circuit results in an improvement in operating speed, up to 1.5 times or more when compared to an equivalent static logic circuit. There are, however, some disadvantages with a domino logic synthesis solution including greater integrated circuit die area and power consumption.

Prior automated mapping solutions for domino logic designs support only a simplified library (non-inverting functions and basic sequential cells), which leads to sub-optimal results when synthesizing with traditional tools like Synopsys Design Compiler® or Cadence RTL Compiler®. Also, very often, the function to be mapped onto a domino logic circuit has to be extracted and implemented separately, which implies a logical re-partitioning and a new interface management.

What is desired, therefore, is a mapping method for a domino logic design that does not include the aforementioned limitations with prior art mapping methods.

SUMMARY OF THE INVENTION

According to the present invention, a fully automated ASIC style domino synthesis flow is provided. The input to the flow is the same as for standard static synthesis environments: an RTL (register-transfer level) description of the design to be synthesized and a set of timing and physical constraints.

In order to map a digital design, whether it is still at the RTL level or already at the gate level, onto a domino logic library it is essential to remove any inversion embedded into the datapaths (i.e. between two domino gates) by pushing the inversion towards the beginning or towards the end of the datapath. The method of the present invention provides an automated solution to the problem described above. Also, the present invention allows taking advantage of all the state-of-the-art synthesis and optimization techniques available in commercial tools (like the Synopsys Design Compiler®) with no limitation.

In order to use domino logic in an automated flow an initial synthesis is performed using a pre-characterized domino cell library with a simplified timing model where the clocking logic has been hidden, and only the evaluate timing arcs are considered (not the precharge). Moreover, this library is augmented with negative unate or binate cells, which are eventually replaced by domino gates, but which help the synthesis tool to produce better results. Since synthesis tools need inverters to function, the static library inverter models are also provided. This synthesis step is identical to that used in static synthesis. The next step in the flow is to unate the design. (As is known in the art, positive unate functions propagate transitions with no inversion.) In this step all the inverters are removed from the design by pushing them to the inputs or outputs of each pipeline stage, by recursively applying De Morgan's Law. The next step is to place the design. This is typically done using Physical Compiler® from Synopsys. After the cells have been placed the design is phase assigned. Phase assignment ensures that all domino cells are clocked by the correct clock phase, that all static cells (non-inverting static cells allowed in the design) do not cause any domino cell violations, and, that the inputs and outputs of the design (coming from either static or domino modules) are correctly operating. The design is then imported into the place and route tool for completing the physical design.

The method of the present invention optimally uses the logic optimization and technology mapping features available in synthesis tools, such as the Synopsys Design Compiler®. These synthesis tools often assume the presence of NAND gates, NOR gates, XOR gates and multiplexers. The presence of these gates allows for certain optimized logic structures to be invoked by the tool (specifically for datapaths implementing complex arithmetic operations). The RTL may also call for complex sequential functions or explicitly instantiate complex block-like memories. The unate method of the present invention allows the tool to optimize assuming the presence of these cells, with some of the cells being automatically replaced during the unate step to lead to a functionally correct domino design.

The new unate process of the present invention can use any RTL or netlist without modification, which avoids a painful and error prone re-partitioning or re-writing process. This is especially important when using soft or firm third-party IPs, which are usually not allowed to be modified. In addition, the turn around time of the mapping process is improved.

The synthesis tool can use potentially any combinational function during the technology mapping and the consecutive optimizations, which leads to a superior quality of results. This is especially true with datapath compilers like Synopsys Module Compiler®, which requires NAND gates, NOR gates and multiplexers to operate. Typically, this results in a 5% increase in speed with a 10% reduction in circuit area.

The synthesizable nature of the method of the present invention and the layout compatibility among the domino and static cells allows users to easily limit the use of domino logic to only those portions of the design requiring the additional speed advantage provided by the domino logic cells.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIGS. 2-9 all pertain to an operational sequence of the unate step, wherein:

FIG. 2 is a schematic diagram showing certain logic gates remaining as static cells;

FIG. 3 is a sequence of two logic diagrams showing the removal of dangling cones;

FIG. 4 is a sequence of two logic diagrams showing the marking of inversions;

FIG. 5 is a sequence of two logic diagrams showing the marking of binate cones for duplication;

FIG. 6 is a logic diagram showing endpoint marking;

FIG. 7 is a sequence of two logic diagrams showing the implementation of a reverse traversal step in which DeMorgan's law is applied;

FIG. 8 is a logic diagram showing the application of a "commit changes" step; and FIG. 9 is a logic diagram showing the processing of the primary inputs and outputs.

DESCRIPTION OF A REPRESENTATIVE EMBODIMENT

Figure 1A:
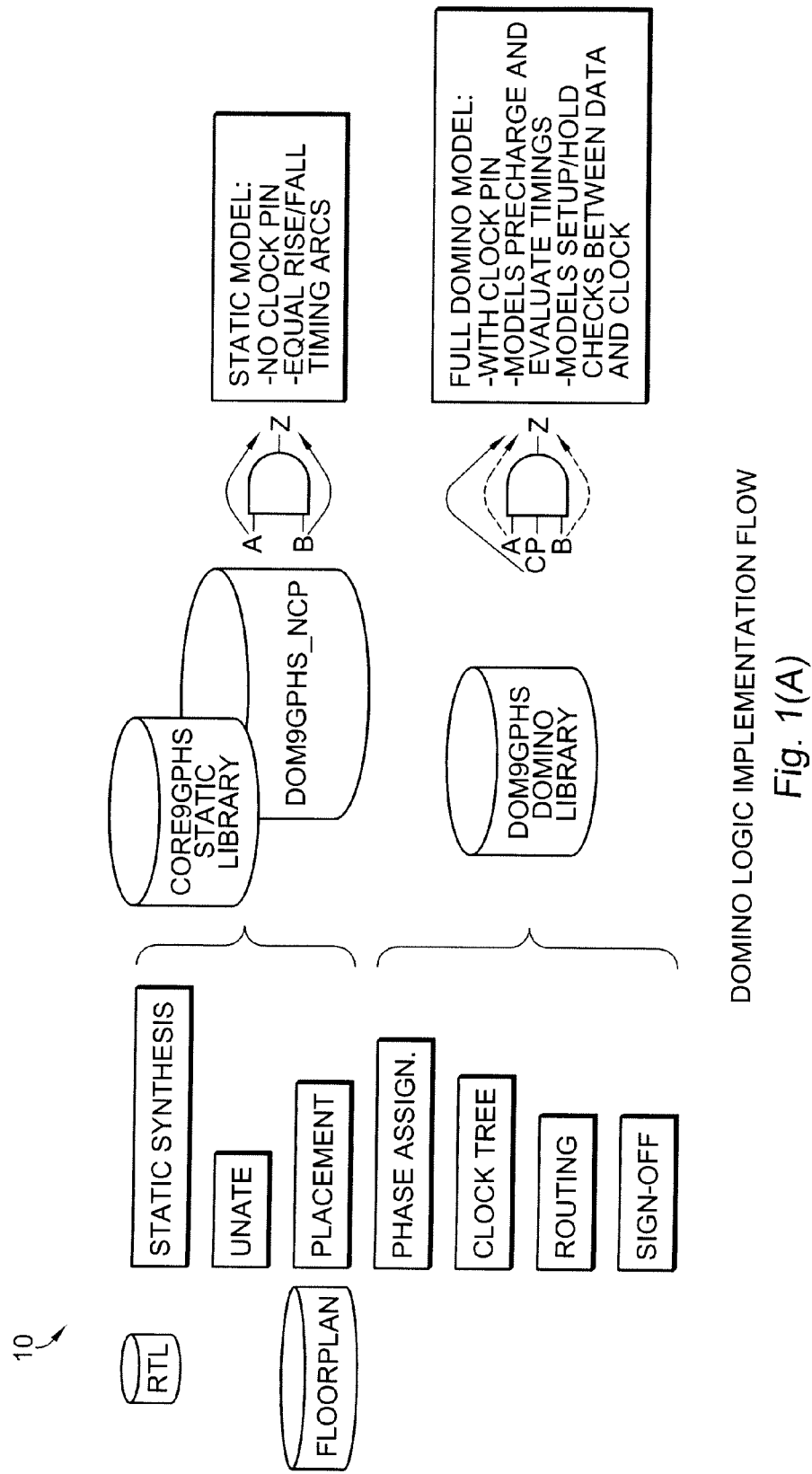
FIG. 1(a) is combined block and flow diagram of a domino logic implementation flow according to the present invention including a unate step.

The very first step of the design flow 10 according to an embodiment of the present invention shown in FIG. 1(a) is a synthesis mapping of an HDL description on to a version of the domino library where the timing model has been simplified (the clock pins have been removed and the fall delays have been made equal to the rise delays, making the domino cells look like static cells), augmented with some static inverting and/or non-unate functions (inverters, NORs, NANDs, XORs, and MUXes). The initial synthesis and reasons therefore are discussed above in the Summary of the Invention. The full domino model includes the CP clock pin, models precharge and evaluate timings, and models setup/hold checks between data and clock. This model will only start being used during the phase assignment step of the flow shown in FIG. 1(a).

Figure 1B:
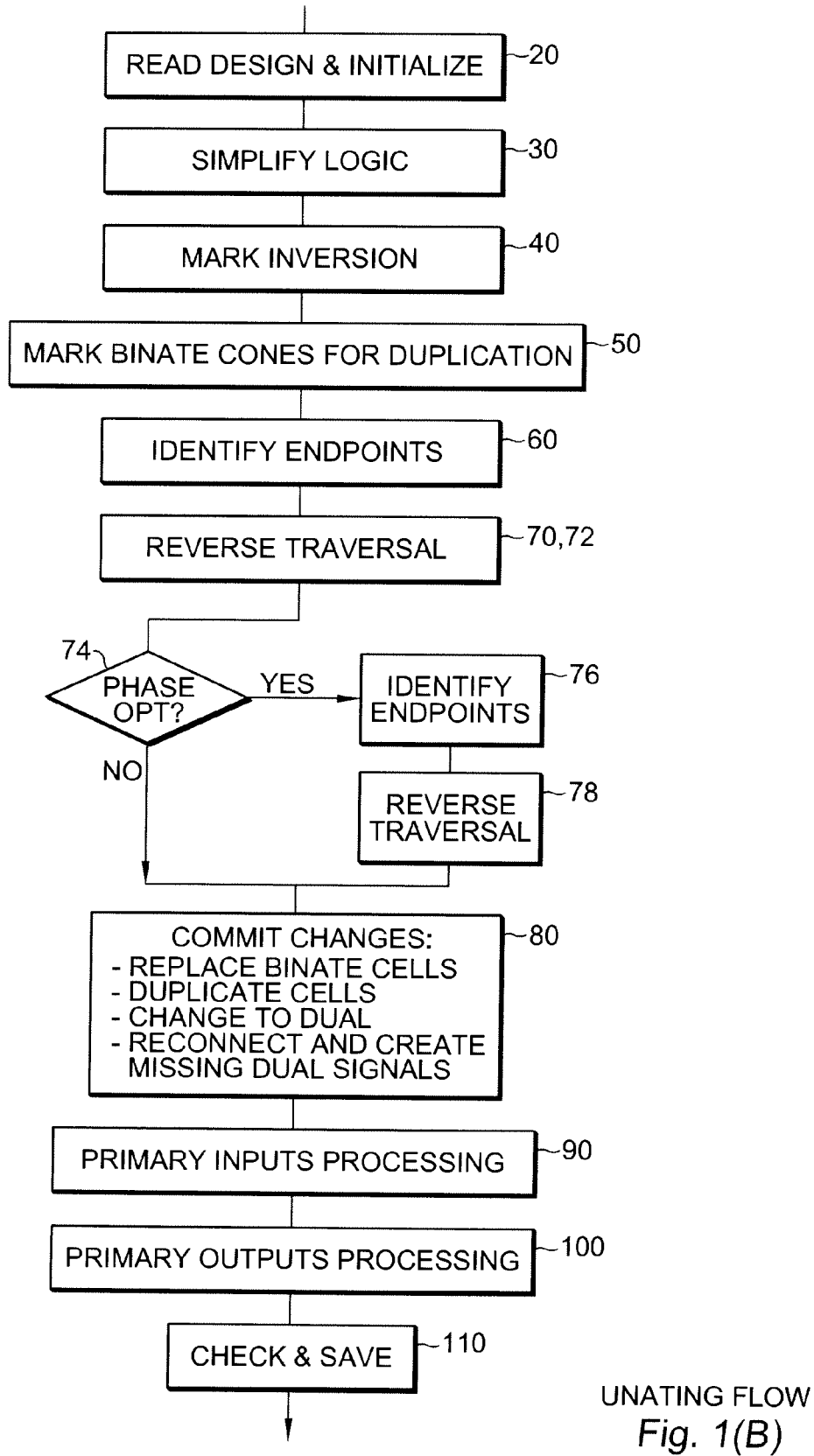
FIG. 1(b) is a block diagram of the unate step of FIG. 1(a)

A description of the unate process defining the sequence of operations is shown in the flowchart of FIG. 1(b) and includes the following steps, which are described in further detail below: read design and initialize step 20; simplify logic step 30; mark inversion step 40; mark binate cones for duplication step 50; identify endpoints step 60; reverse traversal step 70, 72; phase optimization decision 74; identify endpoints step 76; reverse traversal step 78; commit changes step 80; primary inputs processing step 90; primary outputs processing step 100; and check and save step 110.

The unate method according to the present invention begins by reading the synthesized design and annotating library information required by the unate process such as dual cell information, inverted pins, pin mapping, and the like.

Figure 2:
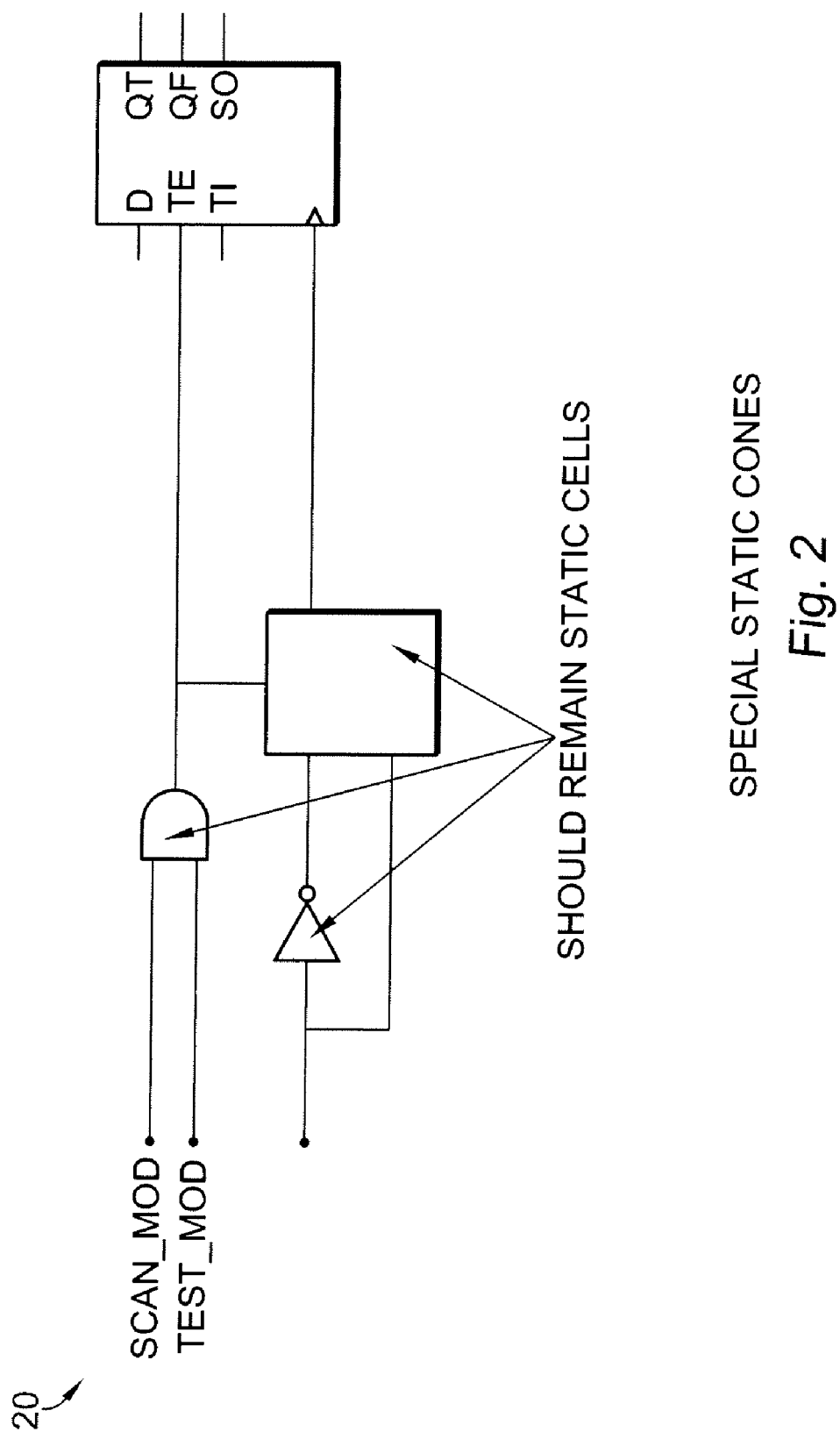

Referring now to FIG. 2, special static cones are marked at step 20. Some sequential cell inputs or primary outputs may be marked to indicate they should not have a domino cell in their fanin cone. This is true, for example, for the clock pins, the test pins or the set/reset pins of the registers. In this case, the script reverts any domino cell found in their fanin cone to an equivalent static cell as shown in FIG. 2, and these cones will not be considered by the unate process.

Figure 3:
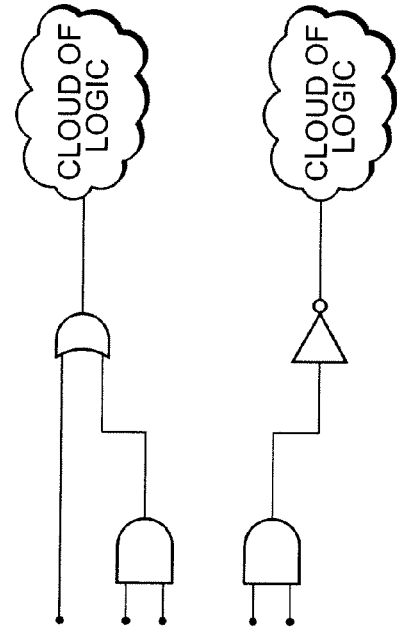

Referring now to FIG. 3, the logic is simplified at step 30. Dangling logic cones 302 are removed as shown in FIG. 3. Logic diagrams with and without the dangling logic cone 302 are both shown in FIG. 3.

Figure 4:
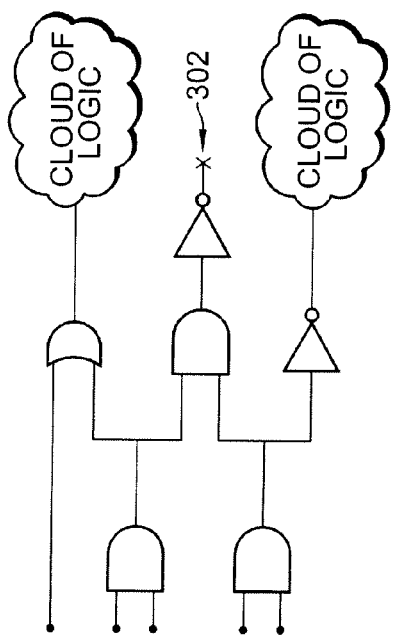
Figure 4:
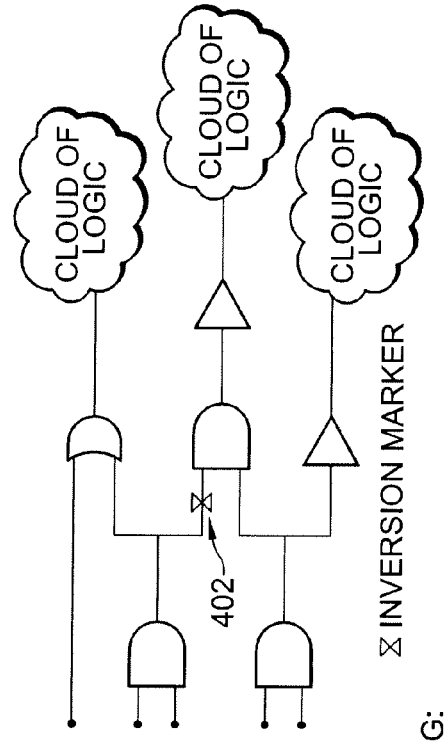

Referring now to FIG. 4, all inversions are marked at step 40, such as inversion marker 402. All of the inversions are turned into pin attributes. For instance, a NAND cell is replaced with an AND cell with an inversion attribute on its output. Then each inversion attribute on an output is pushed to its loads and possibly simplified. If an output marked for inversion drives an input, which is also marked for inversion, both inversions null each other and no inversion markers are used.

Referring now to FIG. 5, binate fanin cones are marked for duplication at step 50. As known in the prior art, binate cells have a function that is not negative nor positive unate. In order to convert such a function into a positive unate function, the invert of at least some of the inputs must be provided. For example, in order to replace an XOR (A^B) with a positive unate equivalent function, the invert of A and B must be provided (Abar and Bbar). Then, the XOR function can be replaced with: (A*Bbar)+(Abar*B). Similarly, to replace a 2-to-1 multiplexer with a positive unate function, the select signal "S" and its invert "Sbar" must be available, and then the function can be replaced with: (A*Sbar)+(B*S). When a signal and its dual are simultaneously needed, the unating process of its input cone is simplified since the cone will have to be entirely marked for duplication. Two examples of marking binate cones for duplication are shown in FIG. 5. The duplication marker symbol 502 is shown in FIG. 5.

Referring now to FIG. 6, the endpoints are registered using endpoint marker 602 at step 60. This step identifies all of the sequential element inputs and primary outputs. Endpoint markers 602 mark the cones of logic that need to be unated. The user may explicitly discard an endpoint (using an attribute) to indicate that its fanin cone does not need to be unated (this implies that the cone is purely static as is described in step 20).

At this point, the designer may also choose to keep binate cells (XOR gates and multiplexers), which are directly and exclusively connected to an endpoint as static cells and move the endpoint to the input of these cells. This technique allows avoiding the systematic duplication of these binate cells input cones.

Figure 7:
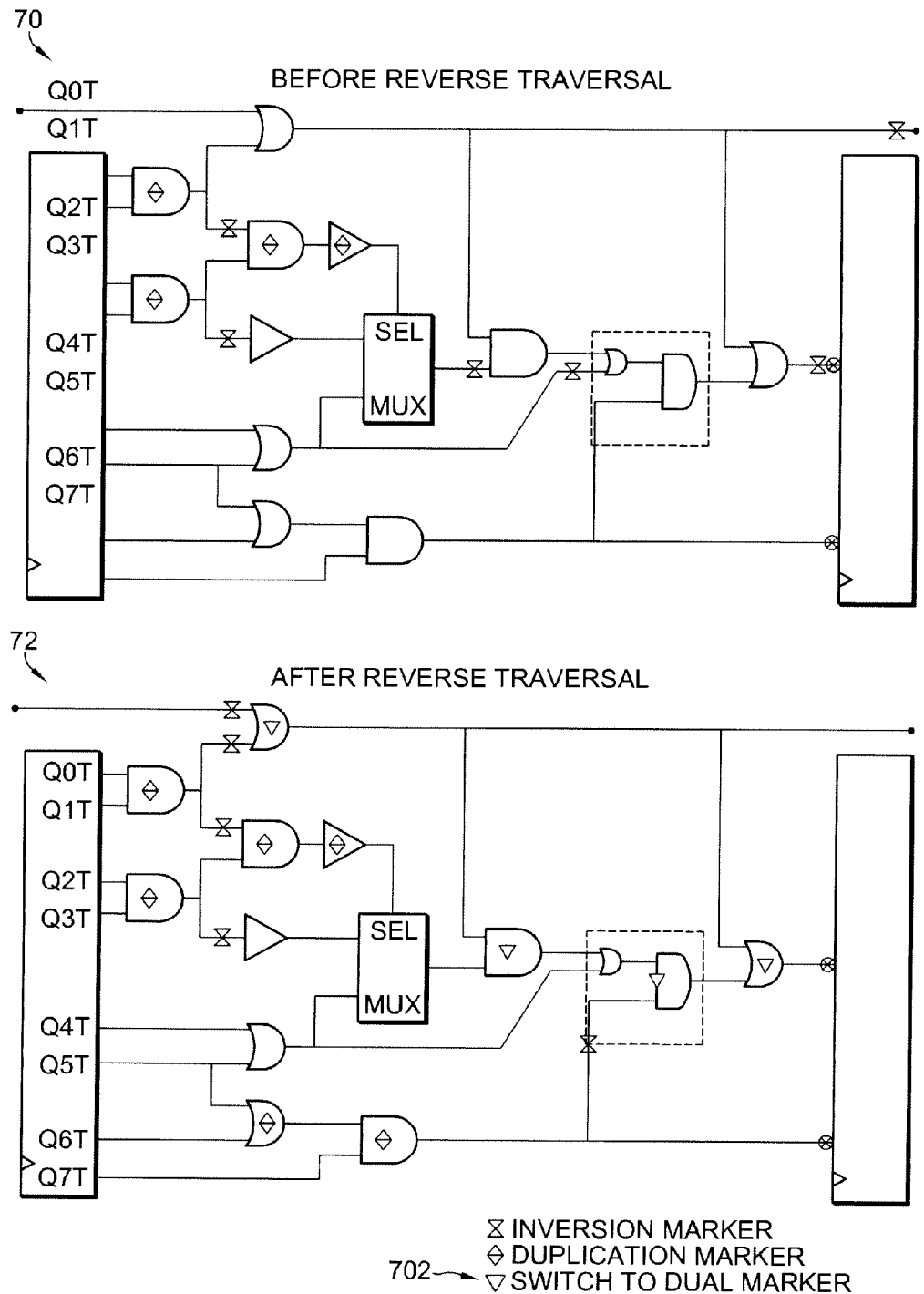

Referring now to FIG. 7, the reverse traversal step applying DeMorgan's law is performed. A logic gate schematic is shown before 70 and after 72 the reverse traversal step is applied. The reverse traversal step traverses the cones of logic starting from the endpoints and applies DeMorgan's law to transfer the inversion from the output to the input of each cell, as is shown in FIG. 7. An additional marker 702 is shown, which indicates the cells that should be replaced by their dual (OR for AND and vice versa), and is referred to as the "switch to dual" marker.

The reverse traversal step stops if one of the following conditions is met: a starting point has been reached (sequential output or primary input); a cell marked for duplication is reached; or both a signal and its dual are needed (the "trapped inverter" situation). In this last case (and if the phase optimization is not enabled) the fanin cone to this point is marked for duplication.

If many of the binate cells are close to the endpoints (as in an adder, for example) and are not kept at static cells, as referred to above with respect to step 60, the traversal is extremely quick since most of the cells have already been marked for duplication and therefore immediately interrupt the traversal.

An optional phase optimization step is also available including a decision block 74, as well as an endpoint identification block 76, and a reverse traversal block 78. When this option is enabled, the previous step is slightly altered. When a "trapped inverter" situation is encountered, an analysis is performed to check if the cone resulting from the inverted branch and the one resulting from the non-inverted branch reconverge (meet) or not. If they do not reconverge, then it can be assumed that this situation may be resolved later on by pushing the inversion towards the outputs, and the reverse traversal continues. At the end of this first traversal, an analysis is performed on all the remaining "trapped inverters", using a technique based on an optimized version of an algorithm described in the prior art. The purpose of the analysis is to identify a number of endpoints whose inversion results in the suppression of the "trapped inverter" situations. Finally, with these new setups on the endpoints, step 70, 72 is repeated and this time, the remaining "trapped inverters" systematically generate a duplication of their fanin cones.

Figure 8:
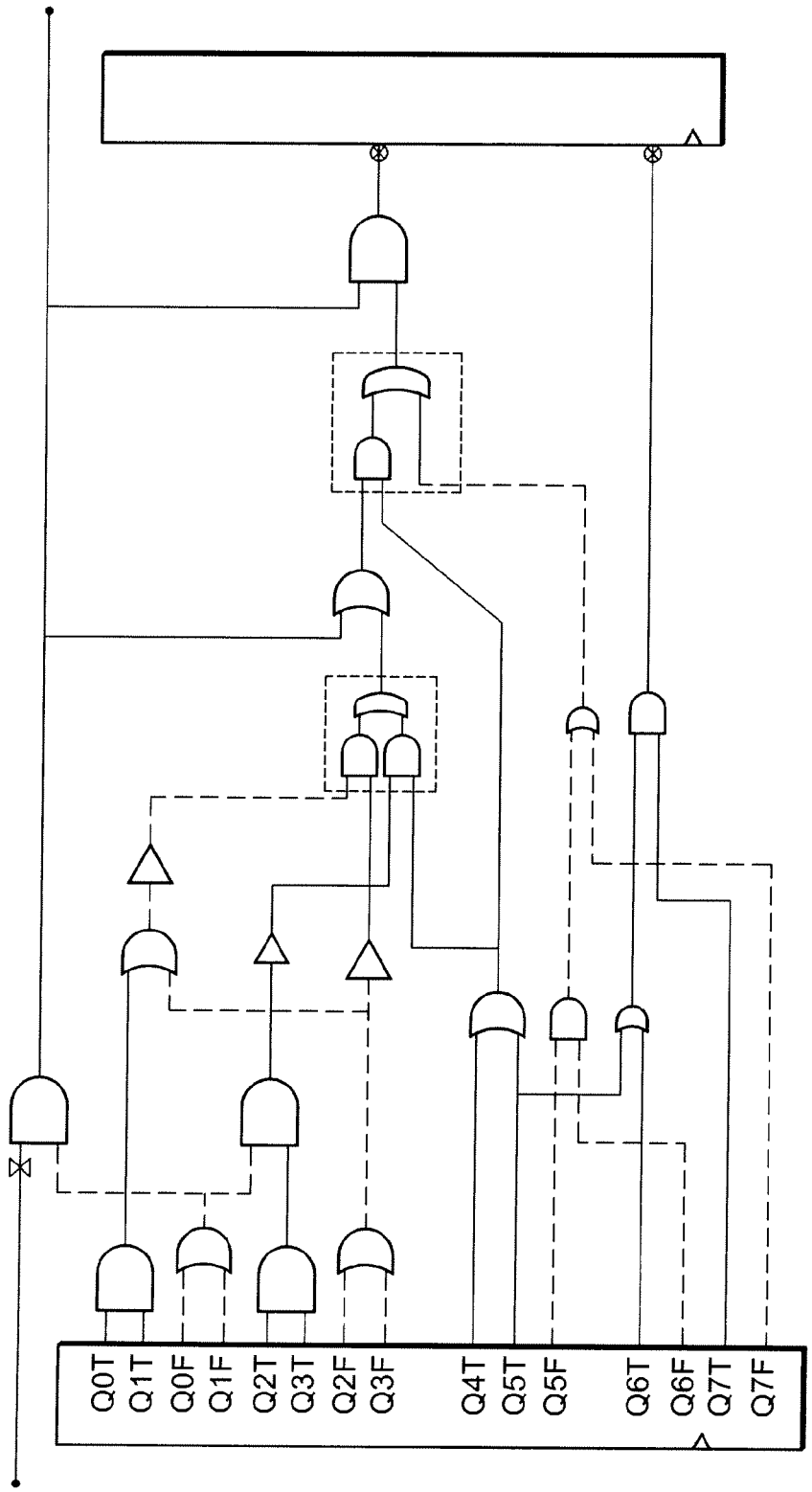

The commit changes step 80 is shown in FIG. 8, which includes the substeps of replacing binate cells with positive unate cells, duplicating logic, replacing cells with their dual and reconnecting the cells possibly using existing dual ports or adding inverters to generate dual signals as is described in further detail below. Binate cells are replaced with unate cells. Since binate cells don't exist in a domino cell representation, they have to be mapped to unate cells. For example, assume that XOR2 gate (A^B) has its inputs connected to nets N0 and Nl. The XOR2 gate is replaced with AND-OR functions A*B+C*D and the pins are mapped respectively to N0, N1', N0', and Nl, where N0' is the dual of N0 and Nl' is the dual of Nl. For each cell marked for duplication, a new cell is created whose function is the dual of the original (OR for AND and vice versa), and whose pins are connected to the dual signals of the original. Cells on which DeMorgan's law has been applied to push an inversion are changed to their dual. All the dual signals that are created are generated either by a cell duplication, or by an existing dual port (each sequential domino cell comes with output pairs QT/QF, or by an added inverter if the original signal comes from a static function.

Figure 9:
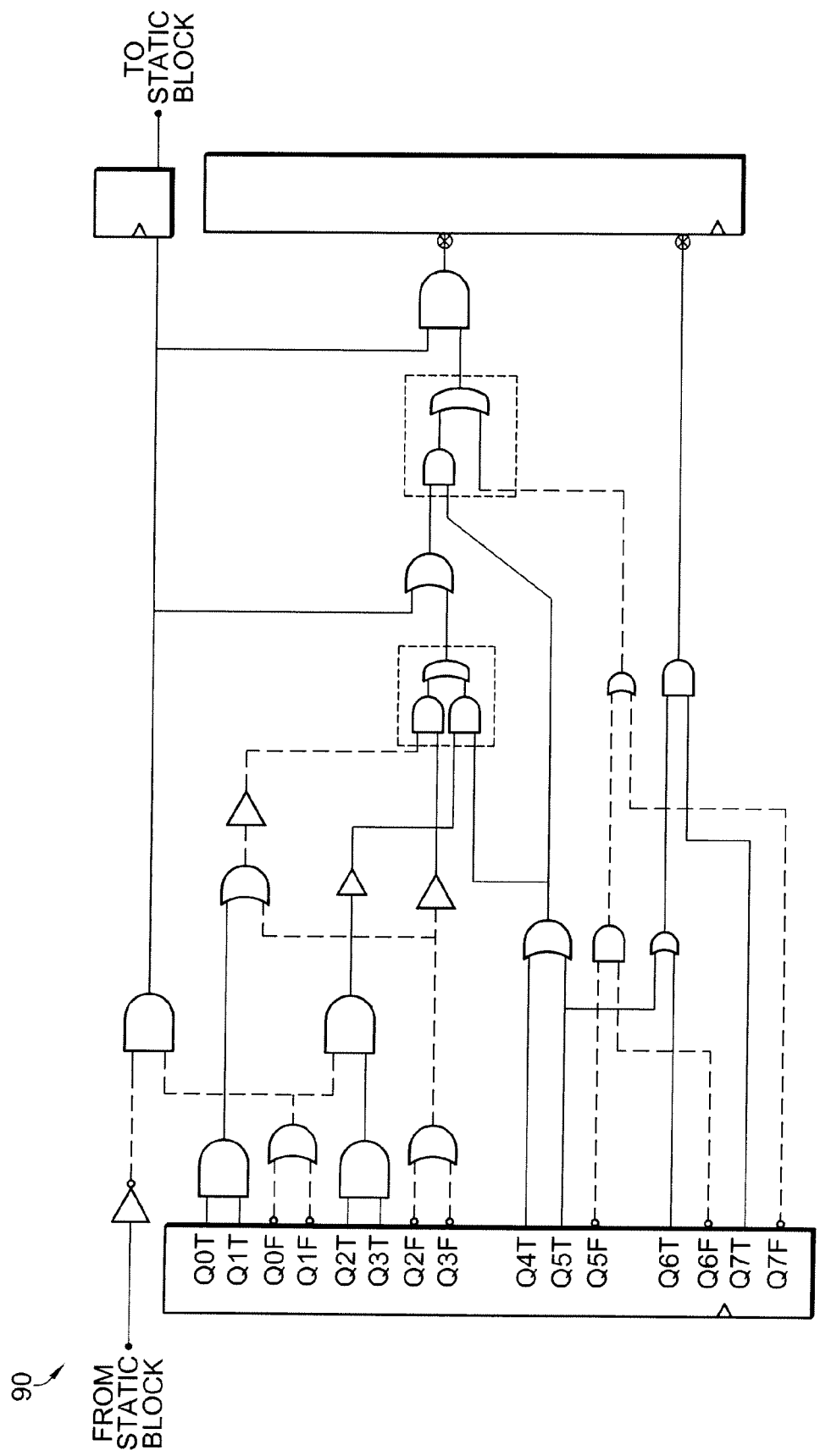

The primary input processing step 90 and primary output processing step 100 are shown in FIG. 9. If an inversion has been propagated to a primary input, two situations can occur. Either the input comes from a static block, in which case the inversion is achieved using a static inverter. Alternatively, the input comes from a dynamic block, in which case the dual signal must be provided to the block, through an additional port. If a primary dynamic output is being provided to a static block, the precharge must be filtered out. This is done by inserting a latch, which is eventually clocked by the appropriate phase, but is set transparent until then.

Finally a check and save step 110 is performed that checks that the logic is properly hooked up and saves the design.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A unate method for a fully automated domino synthesis flow comprising:
   reading and initializing a design including logic with unate and non-unate functions;
   replacing unate and non-unate cells with domino cells and inverters;
   simplifying the logic in the design;
   marking inversions in the design;
   marking binate cones for duplication in the design;
   identifying endpoints in the design;
   pushing any embedded inverters either towards a beginning of a domino data path or towards an end of the domino data path;
   performing a reverse traversal on the design;
   performing a commit changes function on the design;
   processing primary inputs in the design; and
   processing primary outputs in the design.

2. The method of claim 1 further comprising annotating library information required by the unate method.

3. The method of claim 2 wherein the library information comprises cell replacement information, inverted pin information, and pin mapping information.

4. The method of claim 1 further comprising marking special logic cones to indicate an absence of a domino cell.

5. The method of claim 1 wherein simplifying the logic comprises removing dangling logic cones.

6. The method of claim 1 wherein marking inversions comprises turning inversions into pin attributes.

7. The method of claim 1 wherein marking binate cones comprises marking the binate cones for logic duplication.

8. The method of claim 1 wherein identifying endpoints comprises identifying sequential element inputs and primary outputs.

9. The method of claim 1 further comprising discarding an endpoint.

10. The method of claim 1 further comprising keeping binate cells that are directly and exclusively connected to an endpoint as static cells.

11. The method of claim 1 wherein performing a reverse traversal comprises traversing logic cones starting from endpoints and applying DeMorgan's law to transfer an inversion from an output to an input of each cell in the design.

12. The method of claim 1 wherein the reverse traversal step stops if a starting point has been reached, a cell marked for duplication is reached, or both a signal and its dual are needed.

13. The method of claim 1 further comprising a phase optimization step.

14. The method of claim 13 wherein the phase optimization step inverts endpoints in order to minimize trapped inverters.

15. The method of claim 13 wherein the reverse traversal is run again if a polarity of at least one of the endpoints has changed.

16. The method of claim 1 wherein the commit changes step comprises duplicating cells, replacing cells with their dual, and using existing dual ports or adding inverters to generate missing dual signals.

17. The method of claim 1 wherein the commit changes step further comprises replacing binate cells with positive unate cells.

18. The method of claim 1 further comprising performing a check and save step.

19. A fully automated domino synthesis method comprising:

mapping a digital design onto a domino logic library enriched with static negative unate and non-unate cells;

replacing the negative unate and non-unate cells with domino cells and inverters; and pushing any embedded inverter either towards a beginning of a domino data path or towards an end of the domino data path.

20. The method of claim 19 further comprising a phase optimization step.

* * * * *

UNITED STATES PATENT AND TRADEMARK OFFICE
CERTIFICATE OF CORRECTION

PATENT NO. : 7,331,030 B2  Page 1 of 1
APPLICATION NO. : 11/015512
DATED : February 12, 2008
INVENTOR(S) : Bernard Bourgin It is certified that error appears in the above-identified patent and that said Letters Patent is hereby corrected as shown below:

Column 6, line 60 "tuming" should be --turning--

Signed and Sealed this

Twenty-second Day of July, 2008

JON W. DUDAS
*Director of the United States Patent and Trademark Office*